United States Patent [19]
Lin et al.

[11] Patent Number: 5,331,222
[45] Date of Patent: Jul. 19, 1994

[54] COCHLEAR FILTER BANK WITH SWITCHED-CAPACITOR CIRCUITS

[75] Inventors: Jyhfong Lin, Hyattsville, Md.; Shihab A. Shamma, Washington, D.C.; Thomas G. Edwards, College Park, Md.

[73] Assignee: University of Maryland, College Park, Md.

[21] Appl. No.: 53,539

[22] Filed: Apr. 29, 1993

[51] Int. Cl.⁵ .................. H03B 1/04; H04B 1/10
[52] U.S. Cl. ................... 307/520; 307/490; 328/104; 328/127; 328/167
[58] Field of Search ............ 307/490, 521, 520; 328/167, 165, 127, 104, 16, 17, 62

[56] References Cited

U.S. PATENT DOCUMENTS

| | | | |
|---|---|---|---|
| 3,639,842 | 4/1972 | Zacone et al. | 328/104 |
| 4,446,438 | 5/1984 | Chang et al. | 328/127 |
| 4,543,534 | 9/1985 | Temes et al. | 330/9 |
| 4,626,808 | 12/1986 | Nossek | 307/521 |
| 4,894,620 | 1/1990 | Nagaraj | 328/127 |
| 5,168,179 | 12/1992 | Negahban-Hagh | 328/167 |
| 5,182,521 | 1/1993 | Chang et al. | 328/167 |

OTHER PUBLICATIONS

Lin et al. "Realization of Cochlear Filters By VLT Switched-Capacitor Biquads", Mar. 1992, pp. 1-4, IEEE Intn'l Conf. on Acoustics.

Primary Examiner—William L. Sikes
Assistant Examiner—Dinh Le
Attorney, Agent, or Firm—Christopher N. Sears

[57] ABSTRACT

A parallel dilating-filters switched-capacitor filter bank is described in simulation of the cochlea. Area-saving is achieved by filter-sharing, effective sum-gain amplifier designs, and using area efficient nth-order filter designs, and in particular using a biquadratic filter design using charge-differencing. The structure is easily expandable to include more channels by extending with additional filters and output amplifiers, or by using several chips with different sampling frequencies in parallel connection. An offset-compensated area-efficient switched-capacitor sum-gain amplifier circuit design is described and can be used in the filter bank.

12 Claims, 6 Drawing Sheets

General nth-order filter bank

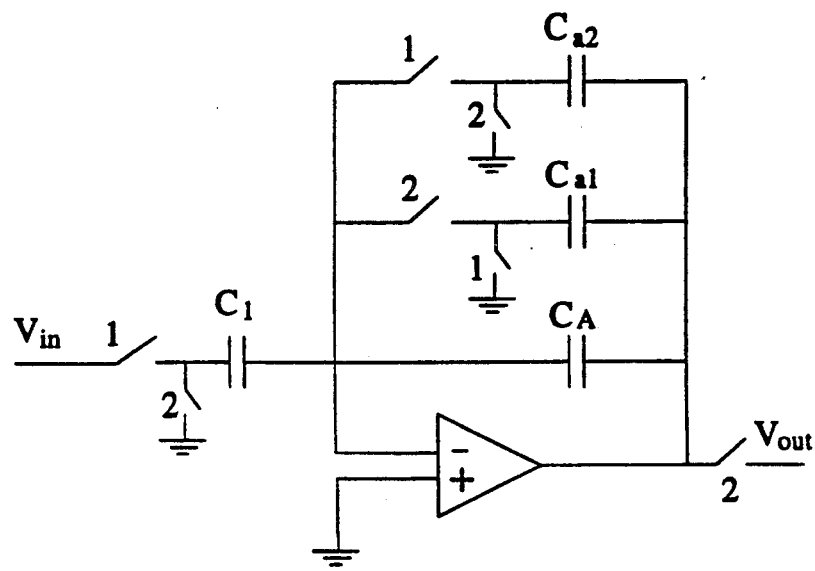
FIGURE 3 : Prior Art
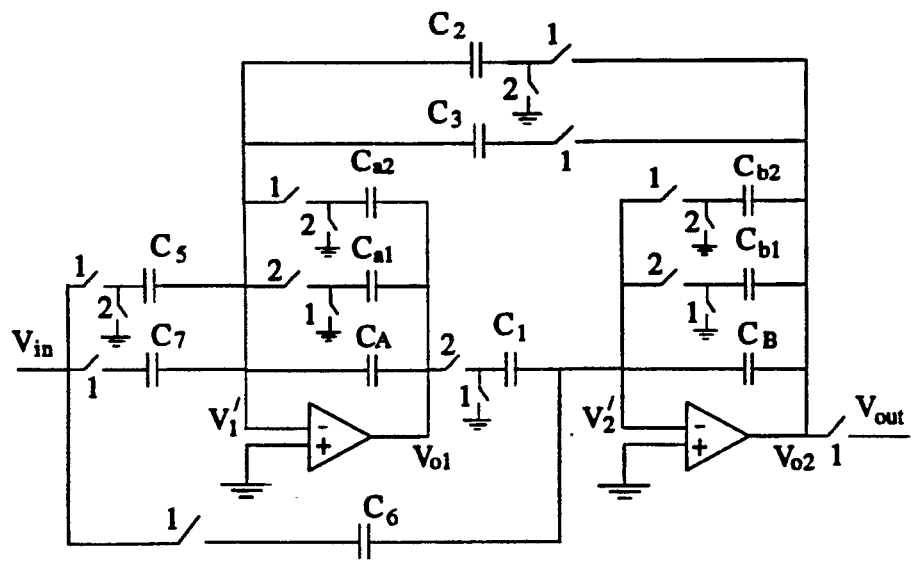
FIGURE 4 : Prior Art

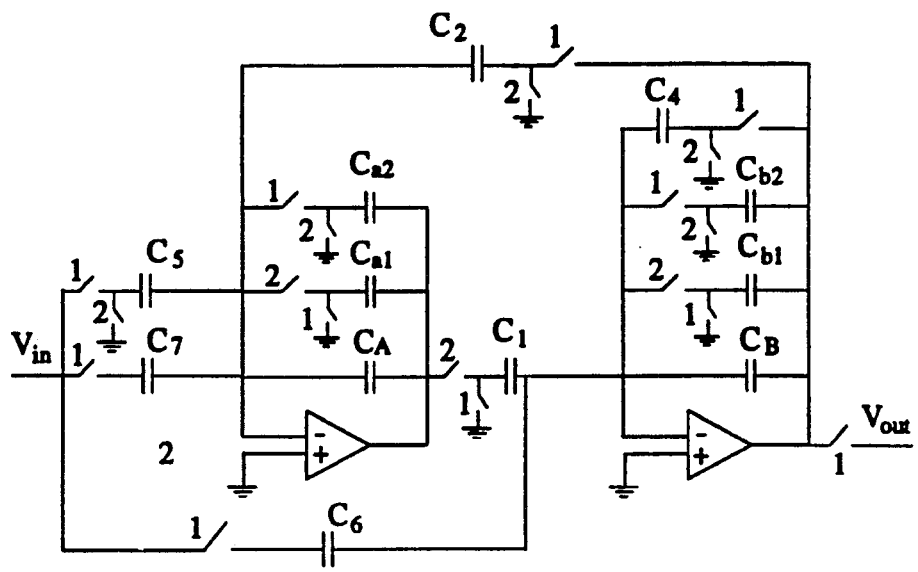
FIGURE 5 : Prior Art
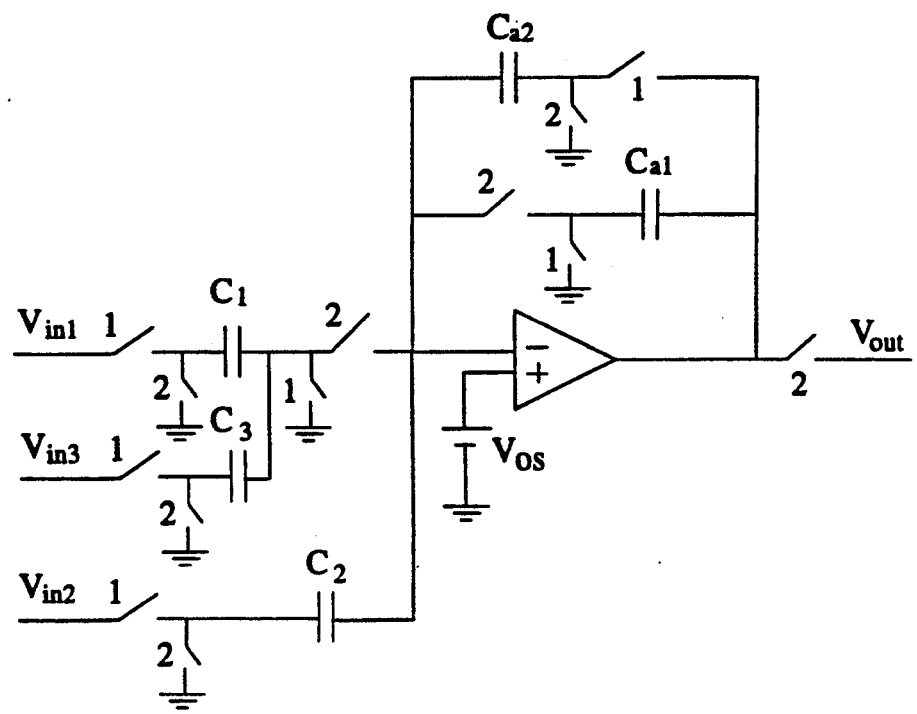
FIGURE 6

COCHLEAR FILTER BANK WITH SWITCHED-CAPACITOR CIRCUITS

The U.S. Government has rights to this invention pursuant to grants from the Office of Naval Research under contract N00014-91-J-1003, the National Science Foundation's Engineering Research Centers Program: NSFD CDR 8803012, and the Air Force Office of Scientific Research under contract AFOSR-88-0204.

FIELD OF INVENTION

The present invention relates to the field of switched-capacitor circuits used in a bi-phasic operated parallel filter bank to implement cochlear filters using very large time constant (VLT) switched-capacitor (SC) filters along with unique SC sum-gain amplifier circuits.

BACKGROUND OF THE INVENTION

In order to mimic the performance of the auditory system, cochlear models have been experimented with over the last few years as front-ends in speech/music analysis and recognition systems. A principle obstacle to their wider acceptance, however, is their heavy computational cost. Consequently, hardware implementations of these models have been an attractive option to achieve real-time performance. So far, successful attempts have employed analog designs, specifically, using subthreshold and operating transconductance amplifiers to build a cascade of second-order filter stages. A second approach is to use a bank of switched-capacitor filters (SCF's). SCF's in general have extremely precise and reliable response characteristics that would obviate the need for any post-design tuning. However, several difficulties arise when implementing the cochlear filters for sound processing using switched-capacitor filters. One is the broad frequency range that stretches to relatively low frequencies. Another is the large number of channels needed. Conventional biquad designs require a capacitance spread ratio of approximately $1/(\Omega_0 T)$, where $\Omega_0$ is the pole frequency of the biquad and T is the sampling period. For low frequency channels, this ratio becomes very large, and VLT circuits have to be used. In the prior VLT circuit design the output signal is only valid in one phase of a bi-phasic timing period not the entire clock period, thus a sum-gain amplifier with same input phase is advantageous since no sample-and-hold circuits are required. In addition, due to a great number of cochlear channels required for real-time-applications, circuit-sharing among channels described below reduces the number of components needed to implement.

The most pertinent prior art as to the filter bank topology includes Chang et al. U.S. Pat. No. 5,182,521 entitled 'Time Multiplexed Switched Capacitor Circuit Having Reduced Capacitance' whose objectives included reduced area and component requirements for voice/music applications. Significant differences of this patent and the instant disclosure includes (1) Chang et al.'s use of multiple states for switching capacitor's versus the instant disclosure's use of only a bi-phase; (2) Chang et al.'s device is more restricted in frequency range versus the instant disclosure; (3) Chang et al's device uses conventional switched-capacitor circuits which requires more silicon area to fabricate compared to the instant disclosure; and (4) Chang et al.'s device shares capacitors versus the instant disclosure's use of the filter bank's parallel sharing of the elementary filter.

The most pertinent art as to the sum-gain amplifier design of the instant disclosure includes Temes et al's U.S. Pat. No. 4,543,534 entitled 'Offset Compensated Switched Capacitor Circuits' which teaches of a sample-hold circuit requirement for the input to the circuit for addition and subtraction operation due to the different time phases used within a time period. The instant disclosure does not require a sample hold circuit to accomplish this objective since all inputs to the amplifier occur during the same time phase. In addition, area-efficient sum-gain amplifiers are designed to reduce silicon area. The instant disclosure uses a similar switching device means for a bi-phasic operating regime as taught by the Temes et al. teaching which is hereby incorporated by reference.

SUMMARY OF INVENTION

Today's speech/music research is focused on real-time processing of information. VLSI hardware implementation of filter banks (such as cochlear filters) has shown promising results in comparison to highly computationally intensive software implementations. Existing approaches based on switched-capacitor filter banks offer reliable performance with no need for post fabrication tuning. However, these existing approaches suffer from problems such as large capacitor area, and high circuit count. The invention herein teaches of a parallel dilating-filters concept and associated area-efficient SC circuits which greatly reduce above problems. The number of filters is reduced by circuit-sharing. In addition, area-efficient charge differencing SC biquads, used to process low frequency range speech and other acoustic signals, can reduce the capacitance spread ratio of each biquad to less than $1/\sqrt{\Omega_0 T}$, where $\Omega_0$ is the pole frequency and T is the sampling period. Finally, no sample-and-hold circuits are required at the output of each individual biquad when the disclosed sum-gain amplifiers (SGA) are used. One of the preferred embodiments includes a 32 channel cochlear filter bank (each channel is 6th-order filter) spanning the frequencies between 200 Hz to 6.4 kHz on a chip of 4.6×6.8 mm² fabricated by metal oxide semiconductor (MOS) technology. Alternative designs covering wider frequency span without much variation of silicon area is straightforward. In addition, the parallel dilating-filter scheme allows for an easy increase of the number of channels by using more chips with slightly different sampling frequencies. This filter bank can be used in multichannel integrated filter banks for various applications such as in speech/music processing and wavelet transforms and so on. The principal objectives of the invention include:

Hardware implementation of filter banks with many channels which allows for real-time speech/music processing (prototype has 32 channels per chip).

A dilating-filters design to permit circuit-sharing.

An area-efficient charge differencing biquad design to reduce capacitance spread ratio.

A SGA-SI amplifier design to eliminate sample-and-hold circuits.

Silicon area savings which allow for more channels per chip.

A modular design provides implementation of filter banks with more channels than are available on a single chip by the parallel connection of same IC chips with different sampling frequencies.

A parasitics-insensitive SGA amplifiers design which is highly area-efficient that accepts inputs during different phases and has offset compensation capability.

BRIEF DESCRIPTION OF DRAWINGS

FIG. 3 shows a charge-differencing integrator which is Prior Art.

FIG. 4 shows a Type I charge-differencing biquad which is Prior Art.

FIG. 5 shows a Type II charge-differencing biquad which is Prior Art.

FIG. 6 shows a sum-gain amplifier with same input phase (SGA-SI) which can be used in FIG. 1.

Note the '1' or 'phase 1' in the circuit designs represents a sampling interval and is closed during such a period and '2' or 'phase 2' designates a reset interval where switch with '1' opens and switch '2' closes.

DETAILED DESCRIPTION

A.1 SYSTEM DESIGN

Dilating-Filters Design

The cochlea can be thought of as a filter bank consisting of a series of bandpass filters, with bandwidths and center frequencies that change systematically along its length. The transfer functions of the channels are related by a dilation.

Figure 1:
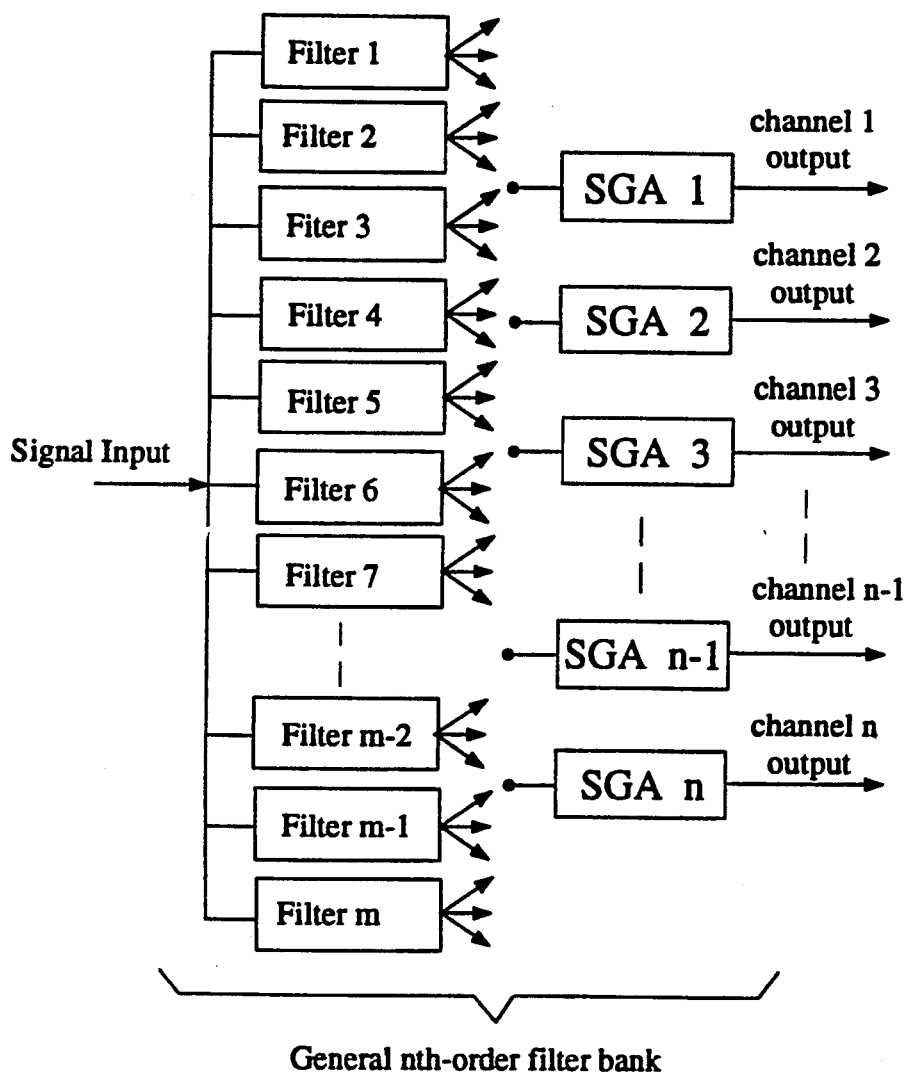
FIG. 1 shows a general system topology of a dilating-filters design with parallel sharing of the circuits. The elementary circuit can be of a nth-order filter.

The general system topology of a filter bank using switched-capacitor circuits in dilating-filters as shown in FIG. 1. Each filter is a nth-order transfer function and each is dilated to one another. By summing these filters, the desired transfer function is approximated. In such a case, filter-sharing is achieved.

Figure 2:
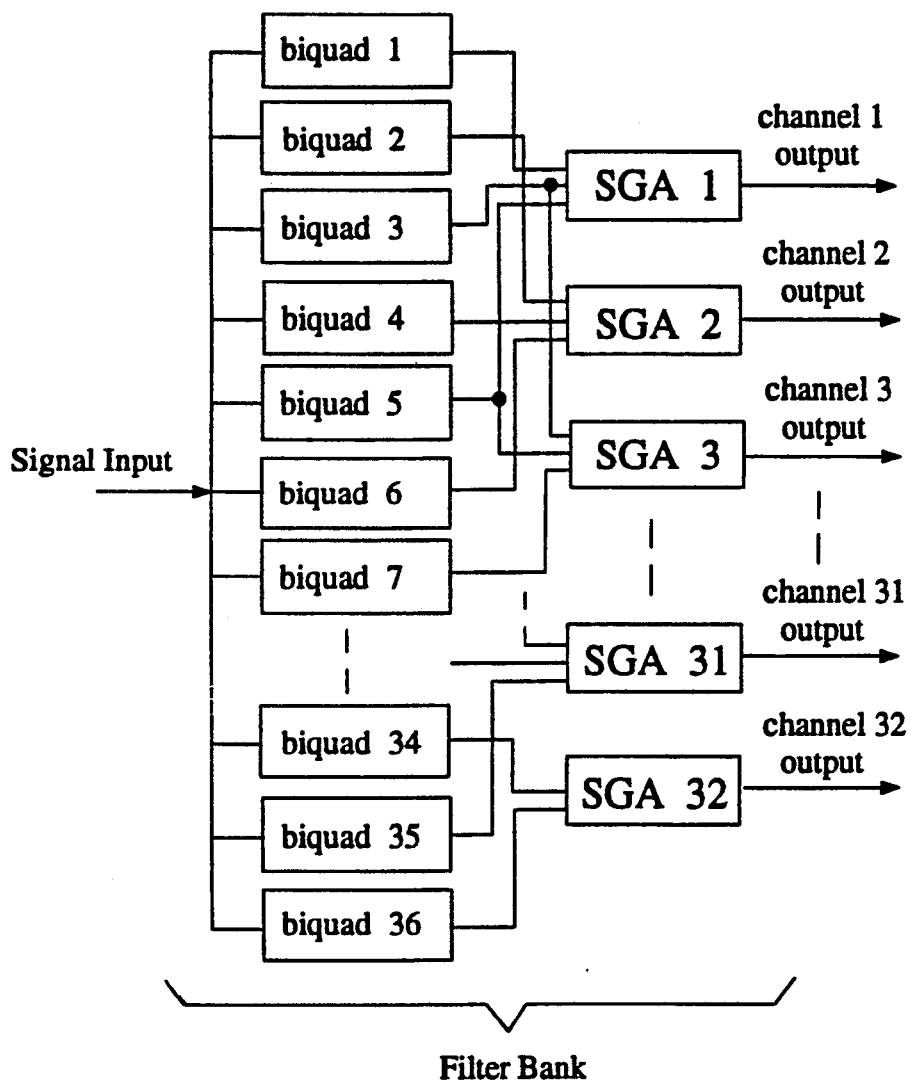
FIG. 2 shows a system topology using a dilating-biquads design with parallel sharing of the circuits.

In a particular design example using biquadratic filters as shown in FIG. 2, each channel is a 6th-order bandpass filter, which is implemented by connecting 3 lowpass biquads (2nd-order filter) in parallel. Gains of the biquads are chosen such that after summing the 3 outputs by a sum-gain amplifier, the desired bandpass function is obtained. Biquads are designed to be dilated with respect to one another. This parallel structure results in reduction of hardware by biquad-sharing. For example, Channel 1 consists of biquads 1, 3 and 5 which are dilated with respect to one and other, and their responses are scaled and summed by the sum-gain amplifier 1. Channel 3 can be realized with the addition of biquad 7 and the sum-gain amplifier 3 as shown in FIG. 2. Thus, for a 32-channel cochlear filters, the parallel structure requires 32+4=36 biquads and 32 sum-gain amplifiers.

Based on the above discussion, the transfer function of the nth-biquad is chosen as $$G_n(s) = H(k^{n-1}s) \qquad (1)$$

where, H(s) is a 2nd-order lowpass filter in the s-domain, k=dilation constant, and n=1, ..., 36. That is, biquads are related by a dilation. Using these biquads, the transfer function of the mth channel of the cochlear filter is $$Y_m(z) = \sum_{i=1}^{i=3} a_i G_{2i+m-2}(z) \qquad (2)$$

where, $a_i$'s are gain factors and G(z) is the bilinear transformation of G(s). Since the same set of $a_i$'s is used in every channel, only one sum-gain amplifier has to be designed. The rest will just be its duplicates. Note that more biquads can be used to approximate the cochlear responses and this usually depends on applications.

More cochlear channels can also be realized by using more biquads and sum-gain amplifiers. Another possibility is to take advantage of the SC circuits by changing the sampling frequency by a factor F, then all the zero and pole frequencies will be changed by the same factor. Hence, by connecting several similar chips together, each with a different sampling frequency, more cochlear channels can be obtained.

A.2 CIRCUIT DESIGN I

Charge-Differencing Integrator

A charge differencing integrator (CD) is shown in FIG. 3. Its operational principle can be stated as follows. In phase 1 and the designated switch closes, the charge $V_{in}(n)C_1$ is accumulated in capacitors $C_A$ and $C_{a2}$, and the output voltage $-V_{in}C_1/(C_A+C_{a2})$ is sampled by $C_{a1}$ simultaneously. In other words, the charge $[V_{in}(n)C_{a1}C_1]/(C_A+C_{a2})$ is stored into $C_{a1}$. In phase 2, a charge $V_{in}(n)C_1$ is effectively pulled back to ground from capacitors $C_A$ and $C_{a1}$. Since $C_A$ received the charge $[V_{in}(n)C_AC_1]/C_A+C_{a2}$ in previous phase, $C_{a1}$ has to compensate the charge difference of $[V_{in}(n)C_{a2}C_1]/(C_A+C_{a2})$ before it redistributes the charge received in previous phase with $C_A$. It can be shown that the transfer function is $$H(z) = \frac{V_{out}(z)}{V_{in}(z)} = -\frac{C_1(C_{a1} - C_{a2})z^{-\frac{1}{2}}}{(C_A + C_{a1})(C_A + C_{a2})(1 - z^{-1})}. \qquad (3)$$

The charge differencing technique is based on both the difference of capacitors and ratio of capacitors, thus the capacitance spread ratio can be made very small. Inverting and non-inverting integrators may be obtained by choosing appropriate capacitor values of $C_{a1}$ and $C_{a2}$. FIG. 3 is parasitic-insensitive and is spike-free. If either $C_{a1}$ or $C_{a2}$ is eliminated, charge differencing integrator becomes one of Nagaraj's integrators, as shown in U.S. Pat. No. 4,894,620 which is hereby incorporated by reference. Charge differencing integrator can be seen as a modified version of Nagaraj's integrators, and Nagaraj's integrators are special cases of the charge differencing integrator. Both integrators use charge cancellation approach to achieve very large time-constant instead of charge elimination which is used in T-network and Huang's integrators. In terms of area-efficiency, the proposed charge-differencing (CD) integrator is much preferred. However, the difference between two capacitors $C_{a1}$ and $C_{a2}$ should not be arbitrarily chosen very small due to the sensitivity problem. Let us consider the quantity c=a±b. The sensitivity of c with respect to a is $S_a^c=(dc/c)/(da/a)=a/(a\pm b)$. If $a\approx b>0$, it is obvious that the case of differencing give higher $S_a^c$. Fortunately, the capacitor ratio can be easily controlled within 0.1% if IC layout is carefully done. The variability (or relative change) would not be too significant. Taking a reasonable choice of $\delta = |C_{a1} - C_{a2}| = 0.5$ for example, total capacitance is about 30% less than that of Nagaraj's integrator but the sensitivity only increases by a few times.

A.3 CIRCUIT DESIGN II

Charge-Differencing Biquads

With the above charge differencing integrator, two types of biquads can also be built (FIGS. 4 and 5). Type-I biquad has a somewhat simpler design equations and is traditionally used in high Q applications, while Type-II is used in low Q filters. From the time domain analysis, the transfer function of biquads is obtained as $$H(z) = -\frac{C_5 \alpha_c}{C_2 \gamma_c} \frac{1 - (2 - \gamma_c - \eta_c)z^{-1} + (1 - \eta_c)z^{-2}}{1 - (2 - \alpha_c - \beta_c)z^{-1} + (1 - \beta_c)z^{-2}}. \quad (4)$$

Where, $$\gamma_c = \frac{C_1 C_5 (C_{a1} - C_{a2})(C_{b1} - C_{b2})}{C_6 (C_A + C_{a1})(C_A + C_{a2})(C_B + C_{b1})}, \quad (5)$$

$$\eta_c = \frac{C_1 C_7 (C_{b1} - C_{b2})}{C_6 (C_A + C_{a2})(C_B + C_{b1})}. \quad (6)$$

For the Type-I biquad, $$\alpha_c = \frac{C_1 C_2 (C_{a1} - C_{a2})(C_{b1} - C_{b2})}{(C_A + C_{a1})(C_A + C_{a2})(C_B + C_{b1})(C_B + C_{b2})}, \quad (7)$$

$$\beta_c = \frac{C_1 C_3 (C_{b1} - C_{b2})}{(C_A + C_{a2})(C_B + C_{b1})(C_B + C_{b2})}. \quad (8)$$

For the Type-II biquad, $$\alpha_c = \frac{C_1 C_2 (C_{a1} - C_{a2})(C_{b1} - C_{b2})}{(C_A + C_{a1})(C_A + C_{a2})(C_B + C_{b1})(C_B + C_{b2} + C_4)}, \quad (9)$$

$$\beta_c = \frac{C_4 (C_{b1} - C_{b2})}{(C_B + C_{b1})(C_B + C_{b2} + C_4)}. \quad (10)$$

Consider the following transfer function in the s-domain, $$H_d(s) = -k \frac{1 + s/(Q_1 \Omega_1) + s^2/\Omega_1^2}{1 + s/(Q_0 \Omega_0) + s^2/\Omega_0^2}. \quad (11)$$

Defining $x_i = 2/\Omega_i T$ and performing the bilinear transformation, the z-domain transfer function is given by $$H(z) = -k \frac{(x_1^2 + x_1/Q_1 + 1) - (2x_1^2 - 2)z^{-1} + (x_1^2 - x_1/Q_1 + 1)z^{-2}}{(x_0^2 + x_0/Q_0 + 1) - (2x_0^2 - 2)z^{-1} + (x_0^2 - x_0/Q_0 + 1)z^{-2}}. \quad (12)$$

Let, $$\alpha = \frac{4}{x_0^2 + (x_0/Q_0) + 1}, \quad (13)$$

$$\beta = \frac{2x_0/Q_0}{x_0^2 + (x_0/Q_0) + 1}, \quad (14)$$

$$\gamma = \frac{4}{x_1^2 + (x_1/Q_1) + 1}, \quad (15)$$

$$\eta = \frac{2x_1/Q_1}{x_1^2 + (x_1/Q_1) + 1}, \quad (16)$$

then the transfer function becomes $$H(z) = -k \frac{\alpha}{\gamma} \frac{1 - (2 - \gamma - \eta)z^{-1} + (1 - \eta)z^{-2}}{1 - (2 - \alpha - \beta)z^{-1} + (1 - \beta)z^{-2}}. \quad (17)$$

Let the capacitor values be assigned as:

$$C_1 = C_2 = C_{o1} = C_{o2} = 1, \quad (18)$$

$$C_{a2} = C_{b2} = y \geq 0, \quad (19)$$

$$C_{a1} = C_{b1} = y + \delta > 0, \quad (20)$$

$$C_A = C_B = K > 0, \quad (21)$$

where y is chosen to be smaller than 1 in the VLT applications. Comparing the coefficients of eqns. 4 and 17, the K for the Type-I biquad becomes the solution of $$K^2 + (2y + \delta)K + \left(y^2 + y\delta - \frac{\delta}{\sqrt{\alpha}}\right) = 0. \quad (22)$$

For $\Omega_0 T << 1$, and after some simplifications, $$K \approx \sqrt{\delta/(\Omega_0 T)} - 1, \quad (23)$$

$$C_3 = (\beta/\alpha)[\delta/(K + 1 + \delta)] \approx \frac{1}{Q_0} \frac{1}{\sqrt{\Omega_0 T}}. \quad (24)$$

If the Type-II biquad is used, K satisfies the following equation $$K^4 + A_3 K^3 + A_2 K^2 + A_1 K + A_0 = 0. \quad (25)$$

Where, $$A_3 = 4y + 2\delta, \quad (26)$$

$$A_2 = 6y^2 + 6y\delta + \delta^2, \quad (27)$$

$$A_1 = 4y^3 + 6y^2\delta + 2y\delta^2 + \frac{\beta\delta}{\alpha}, \quad (28)$$

$$A_0 = y^4 + 2y^3\delta + y^2\delta^2 + \frac{y\beta\delta + \beta\delta^2 - \delta^2}{\alpha}. \quad (29)$$

In the same way, it can be seen that $$K \approx \sqrt{\delta/(\Omega_0 T)} - 1, \quad (30)$$

$$C_4 = (\beta\delta)/[\alpha(K + 1 + \delta)(K + 1)] \approx \frac{1}{Q_0}. \quad (31)$$

The other capacitor values can now be computed as $$C_5 = k, \quad (32)$$

$$C_6 = \frac{C_5 \delta^2}{\gamma(K + y + \delta)^2(K + y)}, \quad (33)$$

-continued $$C_7 = \frac{\eta C_6(K+y)(K+y+\delta)}{\delta}. \tag{34}$$

It is apparent from the above analysis that the use of the charge differencing technique can reduce the required capacitance spread ratios approximately to $\sqrt{\delta/(\Omega_0 T)}$. This means that a comparable saving in the silicon areas can be achieved with these VLT circuits. Note that above capacitor values are obtained before maximum dynamic range and minimum capacitance scalings. These can be put into constraints before designs if desired transfer function is given or can be performed after designs.

A.4 CIRCUIT DESIGN III

Sum-Gain Amplifier With Same Input Phase (SGA-SI)

In filter bank design example as shown in FIG. 2, the outputs of 3 biquads are summed together to simulate one channel of the cochlear filters. Therefore, a sum-gain amplifier which can sum input signals in the same phase is needed in this system. A new sum-gain amplifier is shown in FIG. 6. and its principle of operation is as follows: Consider input $v_{in1}$ first, while $V_{in2}$ and $V_{in3}$ are set to zero. In phase 2, $C_{a2}$ is discharged, and since in phase 1, the sampling interval, its left plate is connected to V− of the op-amp only, no charge can be injected to $C_{a2}$, and the output remains at ground level, which helps $C_{a1}$ to discharge in this phase. During phase 2, the reset interval, $C_1$, $C_{a1}$, and the op-amp constitute a non-inverting gain stage, which gives $$v_{out}\left(n + \frac{1}{2}\right) = \frac{C_1}{C_{a1}} v_{in1}(n). \tag{35}$$

The input $V_{in3}$ can be analyzed in similar fashion. Next, set $V_{in1}$ and $V_{in3}$ to zero. In phase 2, $C_{a2}$ is discharged as in the previous case, but in phase 1, $C_2$, $C_{a2}$, and the op-amp constitute an inverting amplifier, hence, $$v_{out}(n) = -\frac{C_2}{C_{a2}} v_{in2}(n). \tag{36}$$

This voltage is stored in $C_{a1}$, and is to be held constant during the next phase 2. The final output is the superposition when all the 3 inputs are activated. The transfer function can be obtained as $$v_{out}(z) = \left[\frac{C_1}{C_{a1}} v_{in1}(z) - \frac{C_2}{C_{a2}} v_{in2}(z) + \frac{C_3}{C_{a1}} v_{in3}(z)\right] z^{-\frac{1}{2}}. \tag{37}$$

Hence, the output is the sum of $V_{in1}$ and $V_{in3}$, while subtracts $V_{in2}$, all of which are scaled by appropriate gain factors. The gain factors can be individually controlled through $c_1$, $c_2$, and $c_3$. Moreover, it is obvious that this sum-gain amplifier can be designed to include any number of inputs for either addition or subtraction.

One disadvantage of this sum-gain amplifier is the lack of a continuous feedback path cross the op-amp. Hence, if the op-amp used in this circuit is very fast, a spike at the output may occur at the non-overlapping interval between the two clock phases. This spike is readily removed by connecting a capacitor $C_m$, but not shown, between the op-amp output and the left plate of $C_2$ as shown in FIG. 6. Letting $C_{a1} = C_{a2} = 1$, $A_{op} = 1/\mu \neq \infty$, the offset voltage of the op-amp is $V_{os}$ and ignore the input $V_{in3}$ branch. From time domain analysis, the output voltage can be obtained as $$V_{out}(n+\tfrac{1}{2}) = \alpha_1 V_{in1}(n) + \alpha_2 V_{in2}(n) + \beta \cdot V_{out}(n-\tfrac{1}{2}) + \gamma V_{os}. \tag{38}$$

Where, $$\alpha_1 \approx C_1 - C_1(2 + C_1 + C_2)\mu, \tag{39}$$

$$\alpha_2 \approx -C_2 + C_2(3 + C_1 + 2C_2)\mu, \tag{40}$$

$$\beta \approx 2(1 + C_2)\mu, \tag{41}$$

$$\gamma \approx (1 + C_1) - (1 + C_1)(2 + C_1 + C_2)\mu. \tag{42}$$

Figure 7:
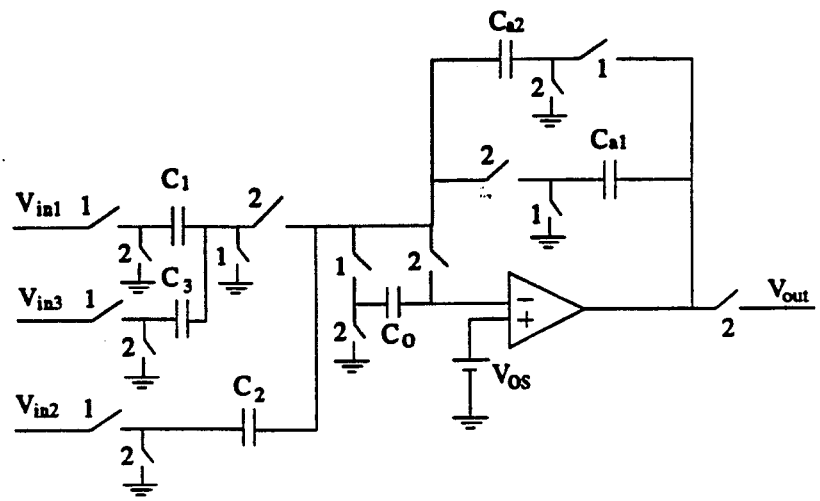
FIG. 7 shows a offset-compensated SGA-SI which can also be used in FIG. 1.

To reduce the effective output offset voltage, an offset-compensated sum-gain amplifier with same input phase is shown in FIG. 7. Assume $V_{op} = 1/\mu$, the offset voltage of the op-amp is $V_{os}$, and ignore the input branch of $V_{in3}$. From time-domain analysis, the output voltage can be obtained as $$V_{out}(n+\tfrac{1}{2}) = \alpha_1 V_{in1}(n) + \alpha_2 V_{in2}(n) + \beta \cdot V_{out}(n-\tfrac{1}{2}) + \gamma V_{os}. \tag{43}$$

Where, $$\alpha_1 \approx C_1 - C_1(3 + C_1 + C_2)\mu, \tag{44}$$

$$\alpha_2 \approx -C_2 + C_2(4 + C_1 + 2C_2)\mu, \tag{45}$$

$$\beta \approx (4 + 3C_2)\mu, \tag{46}$$

$$\gamma \approx (C_1 - C_2) - (1 - 3C_1 - C_1^2 + 5C_2 + 2C_2^2)\mu. \tag{47}$$

The offset voltage is dependent on the difference between input capacitance ($\Sigma_i C_i$) of inverting channels and non-inverting channels, thus it is significantly reduced.

A.5 CIRCUIT DESIGN IV

Area-Efficient Sum-Gain Amplifier

The output signal is valid for entire clock period of a bi-phasic regime if conventional biquads are used. In such an application, area-efficient sum-gain amplifiers can be used to reduce the capacitance area. If VLT biquads (such as charge-differencing biquads) are used, a delay stage is required when connecting biquads and area-efficient sum-gain amplifiers together. First, the design of a parasitics-insensitive area-efficient SGA without offset compensation (shown in FIG. 8) is described. Assume the offset voltage of the op-amp is $V_{os}$, and DC gain is $A_{op} = \infty$, while ignoring input branches of $V_{in2}$ and $V_{in3}$. During phase 1, the sampling interval, $C_1$, $C_B$, and the op-amp constitute an inverting gain stage, which gives $$V_{out}(n) = -\frac{C_1}{C_B} V_{in1}(n) + \left(1 + \frac{C_1}{C_B}\right) V_{os}. \tag{48}$$

At the same time, $C_A$ is discharged and the output voltage is stored in the capacitor $C_a$. During phase 2, the reset interval, the charge stored in $C_a$ is redistributed with $C_A$, thus the output voltage becomes $$V_{out}\left(n+\tfrac{1}{2}\right) = \frac{C_a}{C_A} V_{out}(n) + \left(1 + \frac{C_a}{C_A}\right) V_{os}. \tag{49}$$

Combining eqns. 48 and 49 together, $$V_{out}\left(n+\tfrac{1}{2}\right) = \tag{50}$$

$$-\frac{C_1 C_a}{C_A C_B} V_{in1}(n) + \left(1 + \frac{2C_a}{C_A} + \frac{C_1 C_a}{C_A C_B}\right) V_{os}$$

is obtained. The same analysis can also be applied when other inputs are employed. Now, let $C_A = C_B = 1$ and $A_{op} = 1/\mu \neq \infty$. Using all input signals ($V_{in1}$, $V_{in2}$ and $V_{in3}$), the output voltage is given by $$V_{out}(n+\tfrac{1}{2}) = \alpha_1 V_{in1}(n) + \alpha_2 V_{in2}(n-\tfrac{1}{2}) + \alpha_3 V_{in3}(n) + \gamma V_{os}. \tag{51}$$

Where, $$\alpha_1 \approx -C_a C_1 + C_a C_1(2 + C_a + C_1 + C_2 + C_3)\mu,$$

$$\alpha_2 \approx C_a C_2 - C_a C_2(2 + C_a + C_1 + C_2 + C_3)\mu,$$

$$\alpha_3 \approx -C_a C_3 + C_a C_3(2 + C_a + C_1 + C_2 + C_3)\mu,$$

$$\gamma \approx 1 + C_a(2 + C_1 + C_2 + C_3).$$

The output voltage is the sum of $-V_{in1}$, $-V_{in3}$, and $V_{in2}$, all scaled by appropriate gain factors. In addition, this circuit can be expanded to include any number of inputs either for addition or subtraction. However, in applications with many inputs or high-gain amplifications, where $\Sigma_i |A_{sga,i}| \gg 1$, the effective output offset voltage $V_{os}$ is amplified dramatically which is undesirable.

Figure 9:
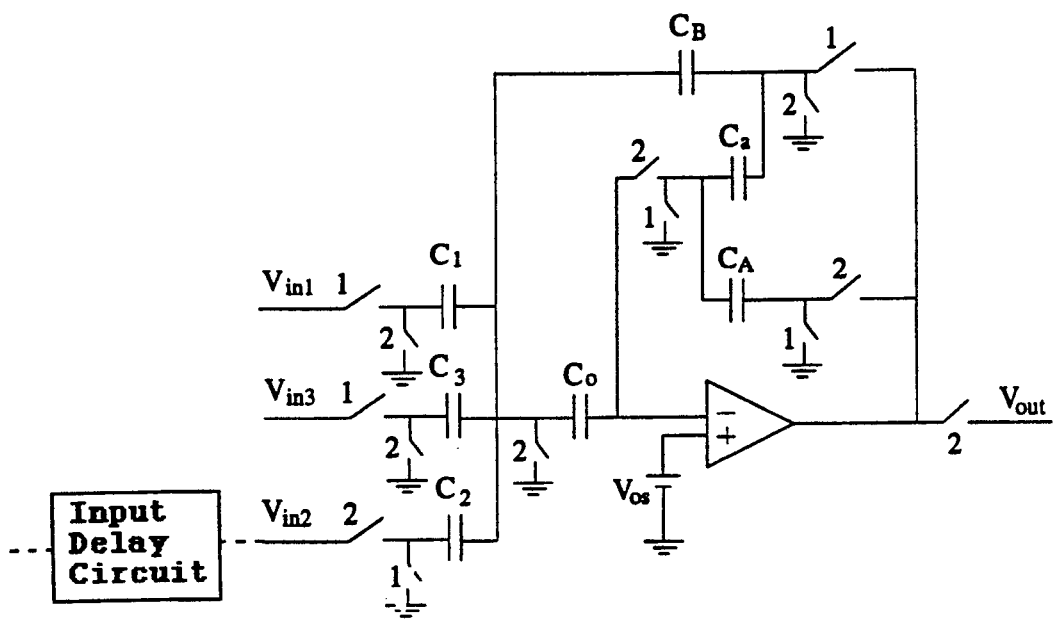
FIG. 9 shows an area-efficient sum-gain amplifier with offset-compensation which can also be used in the amplifier section of FIG. 1.

To reduce the output offset voltage and improve the dynamic range, an area-efficient sum-gain amplifier with offset compensation employing offset-storage capacitor is also described and shown in FIG. 9. Assume the offset voltage of the op-amp is $V_{os}$, $A_{op} = \infty$, and ignore input branches of $V_{in2}$ and $V_{in3}$. During phase 1, the junction of $C_1$, $C_B$, and $C_o$ acts as a virtual ground because $C_o$ was previously charged to $-V_{os}$ and this voltage is preserved in this phase. Thus, $C_1$, $C_o$, $C_B$ and the op-amp constitute an ideal inverting gain stage, which gives the output voltage $$V_{out}(n) = -\frac{C_1 V_{in1}(n)}{C_B}. \tag{53}$$

In addition, $C_A$ is reset to zero, and the voltage of $[C_1 V_{in1}(n)]/C_B$ is stored in $C_a$. During phase 2, the LHS plates of $C_a$ and $C_A$ are connected to the inverting terminal of the op-amp. By charge conservation, the charge stored in $C_a$ only has to redistribute with $C_A$, because there is no charge transfer across $C_o$. Due to the op-amp's offset voltage, the output voltage becomes $$V_{out}\left(n+\tfrac{1}{2}\right) = \frac{C_a}{C_A} V_{out}(n) + \left(1 + \frac{C_a}{C_A}\right) V_{os}. \tag{54}$$

From eqns. 53 and 54, $$V_{out}\left(n+\tfrac{1}{2}\right) = -\frac{C_1 C_a}{C_A C_B} V_{in1}(n) + \left(1 + \frac{C_a}{C_A}\right) V_{os} \tag{55}$$

is obtained. Let $A_{op} = 1/\mu$ and $C_A = C_B = 1$. From the time-domain analysis (using all inputs), the output voltage is given by $$V_{out}(n+\tfrac{1}{2}) = \alpha_1 V_{in1}(n) + \alpha_2 V_{in2}(n-\tfrac{1}{2}) + \alpha_3 \cdot V_{in3}(n) + \beta V_{out}(n-\tfrac{1}{2}) + \gamma V_{os}. \tag{56}$$

Where, $$\alpha_1 \approx -C_a C_1 + C_a C_1(3 + C_a + C_1 + C_2 + C_3)\mu,$$

$$\alpha_2 \approx C_a C_2 - C_a C_2(3 + C_a + C_1 + C_2 + C_3)\mu,$$

$$\alpha_3 \approx -C_a C_3 + C_a C_3(3 + C_a + C_1 + C_2 + C_3)\mu,$$

$$\beta \approx [1 + C_a(1 + C_1 + C_2 + C_3)]\mu,$$

$$\gamma \approx (1 + C_a) - (1 + C_a)(2 + C_a)\mu. \tag{57}$$

Hence, the effective output offset voltage is significantly improved ($\gamma$ is much smaller when compared to eqn. 51) and is not dependent on the input capacitors $C_1$, $C_2$, and $C_3$. Thus, dynamic range is improved. From eqns. 51 and 56, effective gains ($\alpha_1$, $\alpha_2$, and $\alpha_3$) are decreased in the area-efficient SGA designs due to the finite gain of the op-amp. Note that $\beta$ will affect the output voltage, and this will not occur in the area-efficient SGA without offset-compensation. A spiking problem may occur during non-overlapping periods in both area-efficient SGAs, if high-speed op-amps are used. This can be eliminated by connecting one additional capacitor $C_m$ between the output of the op-amp and the RHS plate of the capacitor $C_B$ in the offset-compensated area-efficient SGA.

OTHER EMBODIMENTS

Figure 8:
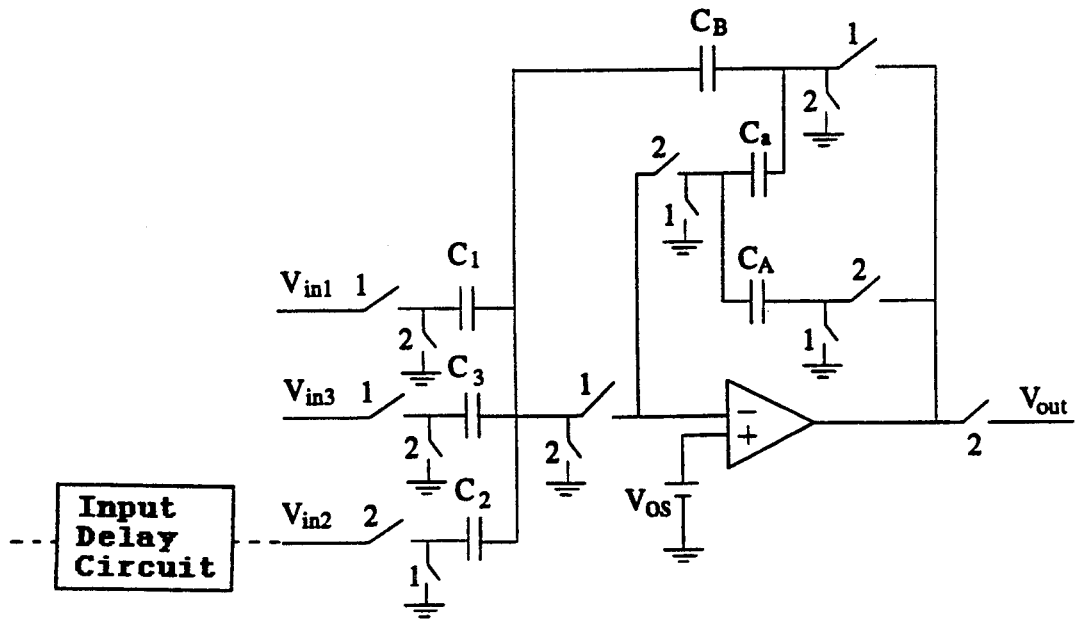
FIG. 8 shows an area-efficient sum-gain amplifier without offset-compensation which can also be used in the amplifier section of FIG. 1.

It is understood that the above described arrangements are merely illustrative of the application of principles of the invention and that other arrangements may be devised by workers in the art without departing from the spirit and scope of the inventions. Alternative designs include multiple inputs to all the amplifier designs where several additions to the inputs of the each SGA's first and second switched-capacitor input arrays from each of the nth-order filters. In the design of a filter bank with area-efficient SGA design, a delay stage may be required to synchronize the timing between the outputs of biquads and the inputs of area-efficient sum-gain amplifiers, in particular, the input to the phase 2 stage of these SGA designs would require modification to delay the time of synchronization with the phase 1 input signals, this is shown in FIGS. 8 and 9 as the input delay circuit. Additionally, the filter bank concept of the instant invention can be implemented in multiple parallel filter banks by the well known technique where filter banks can be paralleled that have differing clock frequencies, see Gregorian et al. book entitled *Analog MOS Integrated Circuits for Signal Processing*, published by Wiley & Sons, 1986, pp. 6-7.

What is claimed is:

1. A bi-phasic switched-capacitor type filter bank with means for transmission of a single input channel signal and means for transmission of multiple output channel signals comprising:

multiple nth-order switched-capacitor (SC) filter means for reducing the capacitor spread ratio and facilitating a very large time constant type filter, each of the nth-order switched-capacitor filter means receives the single input channel signal, each of the nth-order SC filter means is of the same order;

multiple sum-gain amplifier (SGA) means for conditioning each of the multiple output channel signals from the filter bank, the SGA means does not have a sample and hold circuit means; and each output channel signal is conditioned by at least two of the nth-order SC filter means that are in turn connected to one SGA means whereby the number of nth-order SC filter means is reduced by mutual parallel sharing.

2. The filter bank of claim 1 wherein the number of output channel signals equals the number of SGA means, the nth-order of the SC filter is two which is a charge-differencing biquadratic switched-capacitor filter (CDBSCF) whose number is four more than the number of output channels, and each output channel signal comprises at least two conditioned input CDBSCF signals.

3. The filter bank of claim 2 wherein the number of output channels is thirty-two.

4. The filter bank of claim 2 wherein the sum-gain amplifier (SGA) means includes in the bi-phasic operation a sampling interval and reset interval during each cycle of operation of the filter bank, a switching circuit network that controls the charge and discharge of capacitors within the filter bank, whereby a sampling switching circuit means within the filter bank are closed during the sampling interval and open during the reset interval, and a reset switching circuit means within the filter bank are open during the sampling interval and closed during the reset interval, the SGA means comprises:

an operational amplifier with an inverting terminal and an output terminal, the output connects to a first reset switch circuit means;

an input array of switched-capacitors which includes a first array of input switched-capacitors and a second array of input switched-capacitors;

the first array of input switched-capacitors with sampling-reset switching circuit means for connecting the input CDBSCF signals to the inverting terminal during the sampling interval and to a ground during the reset interval;

the second array of input switched-capacitors with sampling-reset switching circuit means for i) connecting the input CDBSCF signals to a first sampling-reset switching circuit means during the sampling interval and ii) connecting to the ground during the reset interval;

the first sampling-reset switching circuit means effects connection to the inverting terminal of the operational amplifier during the reset interval and the ground during the sampling interval;

a feedback circuit which includes a first feedback switched-capacitor and a second feedback switched-capacitor;

the first feedback switched-capacitor with a second sampling-reset switching circuit means for connecting between the inverting terminal and the output terminal of the operational amplifier, wherein the second sampling-reset switching circuit means effects connection to the inverting terminal of the operational amplifier during the sampling interval and the ground during the reset interval; and the second feedback switched-capacitor with a third sampling-reset switching circuit means for connecting between the inverting terminal and the output terminal of the operational amplifier, wherein the third sampling-reset Switching circuit means for connecting the inverting terminal of the operational amplifier during the reset interval and the ground during the sampling interval.

5. The filter bank of claim 4 wherein the sum-gain amplifier means further includes an offset-compensation means by an offset storage capacitor with a fourth sampling-reset switching circuit means and a second reset switching circuit means, a first terminal of the offset storage capacitor connects to the inverting terminal of the operational amplifier, wherein during the sampling interval, a second terminal of the offset storage capacitor connects to both a common connection of the feedback circuit and the input array of switched-capacitor by the fourth sampling-reset switching circuit means, and during the reset interval, the offset storage capacitor's second terminal connects to the ground through the fourth sampling-reset switching circuit means and the offset storage capacitor's first terminal connects to the common connection by the second reset switching circuit means.

6. The filter bank of claim 2 wherein the sum-gain amplifier (SGA) means is an area-efficient amplifier which includes in the bi-phasic operation a sampling interval and a reset interval during each cycle of operation of the filter bank, a switching circuit network that controls the charge and discharge of capacitors within the filter bank, whereby a sampling switching circuit means within the filter bank are closed during the Sampling interval and open during the reset interval, and a reset switching circuit means within the filter bank are open during the sampling interval and closed during the reset interval, the SGA means comprises:

an operational amplifier with an inverting terminal and output terminal, the output terminal connects to a first reset switching circuit means;

an input array of switched-capacitors which includes a first array of input switched-capacitors and a second array of input switched-capacitors and a delayed signal input means for synchronizing the first array with the second array;

the first array of input switched-capacitors with sampling-reset switching circuit means for connecting the multiple CDBSCF input signals to a first common connection that includes a first feedback switched-capacitor circuit and a first sampling-reset switching circuit means, the first sampling-reset switching circuit means in turn connects to the inverting terminal through a second common connection formed by a second feedback switched-capacitor circuit, wherein during the sampling interval, the first array of input switched-capacitors are connected to the inverting terminal, and during the reset interval, the first array of input switched-capacitors connects to a ground;

the second array of input switched-capacitors with sampling-reset switching circuit means connects the multiple input CDBSCF signals to the first common connection, wherein during the reset interval, the second array of switched-capacitors connects to the ground through the first common connection that connects to the first sampling-reset switching circuit means, and during the sampling interval, the input CDBSCF signals are disconnected from the SGA means;

the first feedback switched-capacitor circuit includes a first capacitor with a first terminal and a second terminal, the second terminal of the first capacitor connects to the first common connection, the first terminal of the first capacitor connects to a second sampling-reset switching circuit means which in turn connects to the output terminal of the operational amplifier, wherein during the sampling interval, the first feedback switched-capacitor circuit connects between the inverting terminal and the output terminal of the operational amplifier and during the reset interval, the first capacitor's first terminal connects to the ground through the second sampling-reset switching circuit means;

the second feedback switched-capacitor circuit includes a second capacitor and a third capacitor each with a first terminal and a second terminal, the second and third capacitor's second terminal connects to a third sampling-reset switching circuit means, the second capacitor's first terminal connects to the first capacitor's first terminal, the third capacitor's first terminal connects through a fourth sampling-reset switching circuit means to the output terminal of the operational amplifier, wherein during the sampling interval, the second and third capacitor's second terminal connects to the ground, the second capacitor's first terminal connects to the operational amplifier's output terminal through the second sampling-reset switching circuit means to the ground through the fourth sampling-reset switching circuit means, and during the reset interval, the third capacitor connects between the inverting terminal and the output terminal of the operational amplifier.

7. The filter bank of claim 2 wherein the sum-gain amplifier (SGA) means is an area-efficient offset-compensated amplifier which includes in the bi-phasic operation a sampling interval and reset interval during each cycle of operation of the filter bank, a switching circuit network that controls the charge and discharge of capacitors within the filter bank, whereby a sampling switching circuit means within the filter bank are closed during the sampling interval and open during the reset interval, and a reset switching circuit means within the filter bank are open during the sampling interval and closed during the reset interval, the SGA means comprises:

an operational amplifier with an inverting terminal and output terminal, the output terminal connects to a first reset switching circuit means;

an input array of switched-capacitors which includes a first array of input switched-capacitors and a second array of input switched-capacitors and a delayed signal input means for synchronizing the first array with the second array;

the first array of input switched-capacitors with sampling-reset switching circuit means connects the input CDBSCF signals to a first common connection that includes a first feedback switched-capacitor circuit and a second reset switching circuit means and an offset storage capacitor, the offset storage capacitor in turn connects to the inverting terminal of the operational amplifier through a second common connection formed by common connection with a second feedback switched-capacitor circuit, wherein during the sampling interval, the first array of capacitors connects to the inverting terminal of the operational amplifier through the offset storage capacitor, and during the reset interval, the first common connection connects to a ground through the second reset switching means and the multiple input CDBSCF signals connects to the ground through the first switched-capacitor array;

the second array of input switched-capacitors with sampling-reset switching circuit means connects the input CDBSCF signals to the first common connection, wherein during the reset interval, the second array of switched-capacitors connects to the ground through the second reset switching circuit means, and during the sampling interval, the input CDBSCF signals are disconnected from the second array;

the first feedback switched-capacitor circuit includes a first capacitor with a first terminal and a second terminal, the second terminal of the first capacitor connects to the first common connection, the first terminal of the first capacitor connects to a second sampling-reset switching circuit means which in turn connects to the output terminal of the operational amplifier, wherein during the sampling interval, the first feedback switched-capacitor circuit connects between the inverting terminal and the output terminal of the operational amplifier and during the reset interval, the first capacitor's first terminal connects to the ground through the second sampling-reset switching circuit means;

the second feedback switched-capacitor circuit includes a second capacitor and a third capacitor each with a first terminal and a second terminal, the second and third capacitor's second terminal connects to a third sampling-reset switching circuit means, the second capacitor's first terminal connects to the first capacitor's first terminal, the third capacitor's first terminal connects through a fourth sampling-reset switching circuit means to the output terminal of the operational amplifier, wherein during the sampling interval, the second and third capacitor's second terminal connects to the ground, the second capacitor's first terminal connects to the operational amplifier's output terminal through the second sampling-reset switching circuit means to the ground through the fourth sampling-reset switching circuit means, and during the reset interval, the third capacitor connects between the inverting terminal and the output terminal of the operational amplifier.

8. The filter bank of claim 1 further includes additional parallel filter banks of a similar component design which operate with different time duration intervals for their respective bi-phasic time periods for conditioning the single input channel signal.

9. A bi-phasic operated switched-capacitor sum-gain amplifier (SGA) that includes in the bi-phasic operation a sampling interval and reset interval during each cycle of operation of the SGA, a switching circuit network that controls the charge and discharge of capacitors within the SGA, whereby a sampling switching circuit means within the SGA are closed during the sampling interval and open during the reset interval, and a reset switching circuit means within the SGA are open during the sampling interval and closed during the reset interval, the SGA comprises:

an operational amplifier with an inverting terminal and an output terminal, the output terminal connects to a first reset switching circuit means;

an input array of switched-capacitors which includes a first array of input switched-capacitors and a second array of input switched-capacitors;

the first array of input switched-capacitors with sampling-reset switching circuit means for connecting multiple input signals to the inverting terminal during the sampling interval and to a ground during the reset interval;

the second array of input switched-capacitors with sampling-reset switching circuit means for i) connecting additional multiple input signals to a first sampling-reset switching circuit means during the sampling interval and ii) connecting to the ground during the reset interval;

the first sampling-reset switching circuit means effects connection to the inverting terminal of the operational amplifier during the reset interval and the ground during the sampling interval;

a feedback circuit which includes a first feedback switched-capacitor and a second feedback switched-capacitor;

the first feedback switched-capacitor with a second sampling-reset switching circuit means for connecting between the inverting terminal and the output terminal of the operational amplifier, wherein the second sampling-reset switching circuit means effects connection to the inverting terminal of the operational amplifier during the sampling interval and the ground during the reset interval; and the second feedback switched-capacitor with a third sampling-reset switching circuit means for connecting between the inverting terminal and the output terminal of the operational amplifier, wherein the third sampling-reset switching circuit means for connecting the inverting terminal of the operational amplifier during the reset interval and the ground during the sampling interval.

10. The sum-gain amplifier of claim 9 wherein the the amplifier further includes an offset-compensation means by:

an offset storage capacitor with a fourth sampling-reset switching circuit means and a second reset switching circuit means, a first terminal of the offset storage capacitor connects to the inverting terminal of the operational amplifier, wherein during the sampling interval, a second terminal of the offset storage capacitor connects to both a common connection of the feedback circuit and the input array of switched-capacitor by the fourth sampling-reset switching circuit means, and during the reset interval, the offset storage capacitor's second terminal connects to the ground through the fourth sampling-reset switching circuit means and the offset storage capacitor's first terminal connects to the common connection by the second reset switching circuit means.

11. A bi-phasic, area efficient switched-capacitor sum-gain amplifier (SGA) comprises in the bi-phasic operation a sampling interval and reset interval during each cycle of operation of the SGA, a switching circuit network that controls the charge and discharge of capacitors within the SGA, whereby a sampling switching circuit means within the SGA are closed during the sampling interval and open during the reset interval, and a reset switching circuit means within the SGA are open during the sampling interval and closed during the reset interval, the SGA comprises:

an operational amplifier with an inverting terminal and output terminal, the output terminal connects to a first reset switching circuit means;

an input array of switched-capacitors which includes a first array of input switched-capacitors and a second array of input switched-capacitors;

the first array of input switched-capacitors with sampling-reset switching circuit means for connecting multiple input signals to a first common connection that includes a first feedback switched-capacitor circuit and a first sampling-reset switching circuit means, the first sampling-reset switching circuit means in turn connects to the inverting terminal through a second common connection formed by a second feedback switched-capacitor circuit, wherein during the sampling interval, the first array of capacitors are connected to the inverting terminal, and during the reset interval, the first array connects to a ground;

the second array of input switched-capacitors with sampling-reset switching circuit means connects additional multiple input signals to the first common connection, wherein during the reset interval, the second array of switched-capacitors connects to the ground through the first sampling-reset switching circuit means, and during the sampling interval, the second array's input signals disconnects from the SGA;

the first feedback switched-capacitor circuit includes a first capacitor with a first terminal and a second terminal, the second terminal of the first capacitor connects to the first common connection, the first terminal of the first capacitor connects to a second sampling-reset switching circuit means which in turn connects to the output terminal of the operational amplifier, wherein during the sampling interval, the first feedback switched-capacitor circuit connects between the inverting terminal and the output terminal of the operational amplifier and during the reset interval, the first capacitor's first terminal connects to the ground through the second sampling-reset switching circuit means;

the second feedback switched-capacitor circuit includes a second capacitor and a third capacitor each with a first terminal and a second terminal, the second and third capacitor's second terminal connects to a third sampling-reset switching circuit means, the second capacitor's first terminal connects to the first capacitor's first terminal, the third capacitor's first terminal connects through a fourth sampling-reset switching circuit means to the output terminal of the operational amplifier, wherein during the sampling interval, the second and third capacitor's second terminal connects to the ground, the second capacitor's first terminal connects to the operational amplifier's output terminal through the second sampling-reset switching circuit means to the ground through the fourth sampling-reset switching circuit means, and during the reset interval, the third capacitor connects between the inverting terminal and the output terminal of the operational amplifier.

12. An area-efficient offset-compensated bi-phasic operated switched-capacitor sum-gain amplifier (SGA) comprises in the bi-phasic operation a sampling interval and reset interval during each cycle of operation of the SGA, a switching circuit network that controls the charge and discharge of capacitors within the SGA, whereby a sampling switching circuit means within the SGA are closed during the sampling interval and open during the reset interval, and a reset switching circuit means within the SGA are open during the sampling interval and closed during the reset interval, the SGA comprises:

an operational amplifier with an inverting terminal and output terminal, the output terminal connects to a first reset switching circuit means;

an input array of switched-capacitors which includes a first array of input switched-capacitors and a second array of input switched-capacitors;

the first array of input switched-capacitors with sampling-reset switching circuit means connects multiple input signals to a first common connection that includes a first feedback switched-capacitor circuit and a second reset switching circuit means and an offset storage capacitor, the offset storage capacitor in turn connects to the inverting terminal of the operational amplifier through a second common connection formed by common connection with a second feedback switched-capacitor circuit, wherein during the sampling interval, the first array of capacitors connects to the inverting terminal of the operational amplifier through the offset storage capacitor, and during the reset interval, the first common connection connects to a ground through the second reset switching means and the multiple input signals connects to the ground through the first switched-capacitor array;

the second array of input switched-capacitors with sampling-reset switching circuit means connects additional multiple input signals to the first common connection, wherein during the reset interval, the second array of switched-capacitors connects to the ground through the second reset switching circuit means, and during the sampling interval, the multiple input signals are disconnected from the second array;

the first feedback switched-capacitor circuit includes a first capacitor with a first terminal and a second terminal, the second terminal of the first capacitor connects to the first common connection, the first terminal of the first capacitor connects to a second sampling-reset switching circuit means which in turn connects to the output terminal of the operational amplifier, wherein during the sampling interval, the first feedback switched-capacitor circuit connects between the inverting terminal and the output terminal of the operational amplifier and during the reset interval, the first capacitor's first terminal connects to the ground through the second sampling-reset switching circuit means;

the second feedback switched-capacitor circuit includes a second capacitor and a third capacitor each with a first terminal and a second terminal, the second and third capacitor's second terminal connects to a third sampling-reset switching circuit means, the second capacitor's first terminal connects to the first capacitor's first terminal, the third capacitor's first terminal connects through a fourth sampling-reset switching circuit means to the output terminal of the operational amplifier, wherein during the sampling interval, the second and third capacitor's second terminal connects to the ground, the second capacitor's first terminal connects to the operational amplifier's output terminal through the second sampling-reset switching circuit means to the ground through the fourth sampling-reset switching circuit means, and during the reset interval, the third capacitor connects between the inverting terminal and the output terminal of the operational amplifier.

* * * * *